(12) United States Patent
Kim et al.

(10) Patent No.: US 12,270,112 B2
(45) Date of Patent: Apr. 8, 2025

(54) METHOD OF PREPARING SINGLE-LAYERED MXENES, SINGLE-LAYERED MXENES PREPARED THEREOF, THIN FILM FOR SHIELDING ELECTROMAGNETIC WAVE, AND ELECTRODE

(71) Applicants: University-Industry Cooperation Group of Kyung Hee University, Yongin-si (KR); Korea University Research and Business Foundation, Seoul (KR)

(72) Inventors: Woo Sik Kim, Suwon-si (KR); Sang Hyuk Im, Hwaseong-si (KR); Jin Soo Kim, Yongin-si (KR); Tae Seok Seo, Suwon-si (KR)

(73) Assignees: University-Industry Cooperation Group of Kyung Hee University, Yongin-si (KR); Korea University Research and Business Foundation, Seoul (KR)

( * ) Notice: Subject to any disclaimer, the term of this patent is extended or adjusted under 35 U.S.C. 154(b) by 210 days.

(21) Appl. No.: 17/956,039

(22) Filed: Sep. 29, 2022

(65) Prior Publication Data
US 2023/0265566 A1 Aug. 24, 2023

(30) Foreign Application Priority Data
Feb. 18, 2022 (KR) .................. 10-2022-0021537

(51) Int. Cl.
*C23F 1/16* (2006.01)
*C01B 32/90* (2017.01)
(Continued)

(52) U.S. Cl.
CPC ............ *C23F 1/16* (2013.01); *C01B 32/90* (2017.08); *C23F 1/00* (2013.01); *H05K 9/0081* (2013.01)

(58) Field of Classification Search
CPC ... C23F 1/16; C23F 1/00; C01B 32/90; H05K 9/0081; H05K 9/00; C09K 13/08;
(Continued)

(56) References Cited

U.S. PATENT DOCUMENTS

2013/0029404 A1* 1/2013 Bourgoin ............... C12M 23/22
435/257.1

FOREIGN PATENT DOCUMENTS

| CN | 110272048 A | * | 9/2019 | ............ B82Y 30/00 |
| KR | 10-1573384 B1 | | 12/2015 | |
| KR | 10-2019-0036774 A | | 4/2019 | |

OTHER PUBLICATIONS

Mohammed Al-antaki AH, et al. "Continuous flow vortex fluidic-mediated exfoliation and fragmentation of two-dimensional MXene" (2020) R. Soc. Open Sci. 7: 192255. http://dx.doi.org/10.1098/rsos.192255.

(Continued)

*Primary Examiner* — Duy Vu N Deo
(74) *Attorney, Agent, or Firm* — Westman, Champlin & Koehler, P.A.; Amanda M. Prose

(57) ABSTRACT

Proposed is a preparation method for single-layered MXenes capable of exfoliating a single layer of MXenes from multi-layered MXenes with a high yield. One embodiment of the present disclosure provides a preparation method for single-layer MXenes, the method includes exfoliating a single layer of MXenes from multi-layered Mxenes with a Couette-Taylor reactor (CT reactor), inducing a regular flow.

8 Claims, 15 Drawing Sheets

(51) Int. Cl.
*C23F 1/00* (2006.01)
*H05K 9/00* (2006.01)

(58) Field of Classification Search
CPC ....... Y02E 60/10; B01J 19/0066; B01J 19/18; C01P 2004/24
USPC .......................................................... 216/13
See application file for complete search history.

(56) References Cited

OTHER PUBLICATIONS

Seo, D. et al. "Numerical simulation of Taylor-Couette fluidic device for the exfoliation of two-dimensional materials" Chemical Engineering Journal (2020) 399, 125726.

Qin, T. et al. "Recent Progress in Emerging Two-Dimensional Transition Metal Carbides" Nano-Micro Lett. (2021) 13:183.

Office Action issued in KR application No. 10-2022-0021537, dated Jan. 22, 2024, with machine English translation.

Jeong, J-M et al. "Production of two-dimensional nanosheets using Taylor-Couette flow reactor and its application" Korea Advanced Institute of Science and Technology (2018) <https://koasas.kaist.ac.kr/handle/10203/264833>.

* cited by examiner

MT : irregular flow

CT : regular flow shaking flow

CT : ~433rpm

CT : ~980rpm

CT : ~1750rpm

CT : ~2400rpm

CT : ~2400rpm
(10min)

CT : ~2400rpm (20min)

CT : ~2400rpm (30min)

CT : ~2400rpm
(40min)

CT : ~2400rpm
(50min)

METHOD OF PREPARING SINGLE-LAYERED MXENES, SINGLE-LAYERED MXENES PREPARED THEREOF, THIN FILM FOR SHIELDING ELECTROMAGNETIC WAVE, AND ELECTRODE

The present application claims priority to Korean Patent Application No. 10-2022-0021537, filed in the Korean Intellectual Property Office on Feb. 18, 2022, the entire contents of which are incorporated herein by reference.

BACKGROUND OF THE INVENTION

1. Field of the Invention

The present disclosure relates to a preparation method for single-layered MXenes, single-layered MXenes prepared thereof, a thin film for shielding electromagnetic wave, and an electrode. More particularly, the present disclosure relates to a preparation method for single-layered MXenes capable of increasing the yield of single-layer MXenes without physical fragmenting of the multi-layered MXenes, and the single-layered MXenes, a thin film for shielding electromagnetic wave, and an electrode prepared thereof.

2. Description of the Related Art

MAX is a compound represented by $M_{n+1}AX_n$ and forms a structure in which an atomic layer composed of element (A) is regularly inserted between the layered structures of a metal carbide layer or a metal nitride layer. Accordingly, MAX has excellent heat and electrical conductivity because it has good ductility, easy mechanical processing, and metal properties. In fact, MXenes are nano materials that can dramatically improve the problems of existing metal and magnetic materials and have 10 times better electrical properties than graphene.

When the atomic layer is etched in such MAX material, the metal carbide or metal nitride constituting the metal carbide layer or the metal nitride layer has only a Van der Waals force, thereby forming a structure capable of occurring exfoliating from each other, and the formed structure is called 'MXenes'. For example, it has been reported that the atomic layer (AL) may be selectively etched using HF, a strong acid, to exfoliate with a titanium carbide nanoplate in the MAX material of the $Ti_3AlC_2$ structure, and thus the process of forming a multilayer MXenes is known.

A conventional preparation method for single-layered MXenes, the method including: etching off an atomic layer from the MAX; removing the atomic layer from the etched MAX using stirring flow, etc., and exfoliating the multilayer MXenes; exfoliating the single-layered MXenes from the multi-layered MXenes using ultrasonic waves or stirring flow, etc., was mainly used. However, in the case of ultrasonic wave treatment, there was a problem in that the multi-layered MXenes were broken due to high output energy, and in the case of stirring flow, non-exfoliated multi-layered MXenes increased due to irregular flow, so the yield of single-layer MXenes was not high.

SUMMARY OF THE INVENTION

An objective of the present disclosure is to solve the problem that was difficult to exfoliate a single-layered MXenes by conventional irregular stirring flow or ultrasonic wave treatment. The objective of the present disclosure is to provide a preparation method for single-layered MXenes capable of increasing the yield of single-layered MXenes without physical fragmenting of the multi-layered MXenes.

Another objective of the present disclosure is to provide a preparation method for single-layered MXenes that can be applied to a continuous process as well as a batch process, thereby obtaining a large amount of single-layer MXenes.

Still another objective of the present disclosure is to provide a preparation method for single-layered MXenes that minimizes deformation of the single-layered MXenes.

Still another objective of the present disclosure is to provide a single-layered Mxenes prepared by the preparation method for the single-layered MXenes.

Still another objective of the present disclosure is to provide a thin film for shielding electromagnetic wave, including the single-layered MXenes.

Still another objective of the present disclosure is to provide an electrode including the single-layered MXenes.

The objectives of the present disclosure are not limited to the above-mentioned objectives, and other objectives and advantages of the present disclosure not mentioned can be understood by the following description and will be more clearly understood by the examples of the present disclosure. Moreover, it will be readily apparent that the objectives and advantages of the present disclosure can be realized by the means and combinations thereof indicated in the claims.

One embodiment of the present disclosure for achieving the above objective provides a preparation method for single-layered MXenes, the method includes exfoliating a single layer of MXenes from multi-layered Mxenes with a Couette-Taylor reactor (CT reactor), inducing a regular flow.

In detail, the MAX may be a compound represented by the following Formula 1.

[Formula 1]

In Formula 1, M may be a transition metal, A may be any one selected from Group 12 to Group 16 elements, X may be carbon or nitrogen, and n may be 1 to 4. In Formula 1, M may be any one selected from the group consisting of Sc, Lu, Ti, Zr, Hf, V, Nb, Ta, Cr, Mo, Mn, Hb, and Co, and A may be any one selected from the group consisting of Cd, Al, Ga, In, Tl, Si, Ge, Sn, Pb, P, As, and S.

According to an embodiment of the present disclosure, in order to solve the problem that it is difficult to exfoliate a single layer of MXenes from multi-layered MXenes by conventional irregular stirring flow or ultrasonic wave treatment, provided is a preparation method for single-layered MXenes capable of increasing the yield of single-layered MXenes without physical fragmenting of the multi-layered MXenes. The high yield single-layered MXenes prepared by this method may be widely applied to the field of electromagnetic wave shielding materials or catalysts.

In addition to the above-described effects, the specific effects of the present disclosure will be described together while explaining the specific contents for carrying out the disclosure below.

DESCRIPTION OF THE PREFERRED EMBODIMENTS

Figure 1:
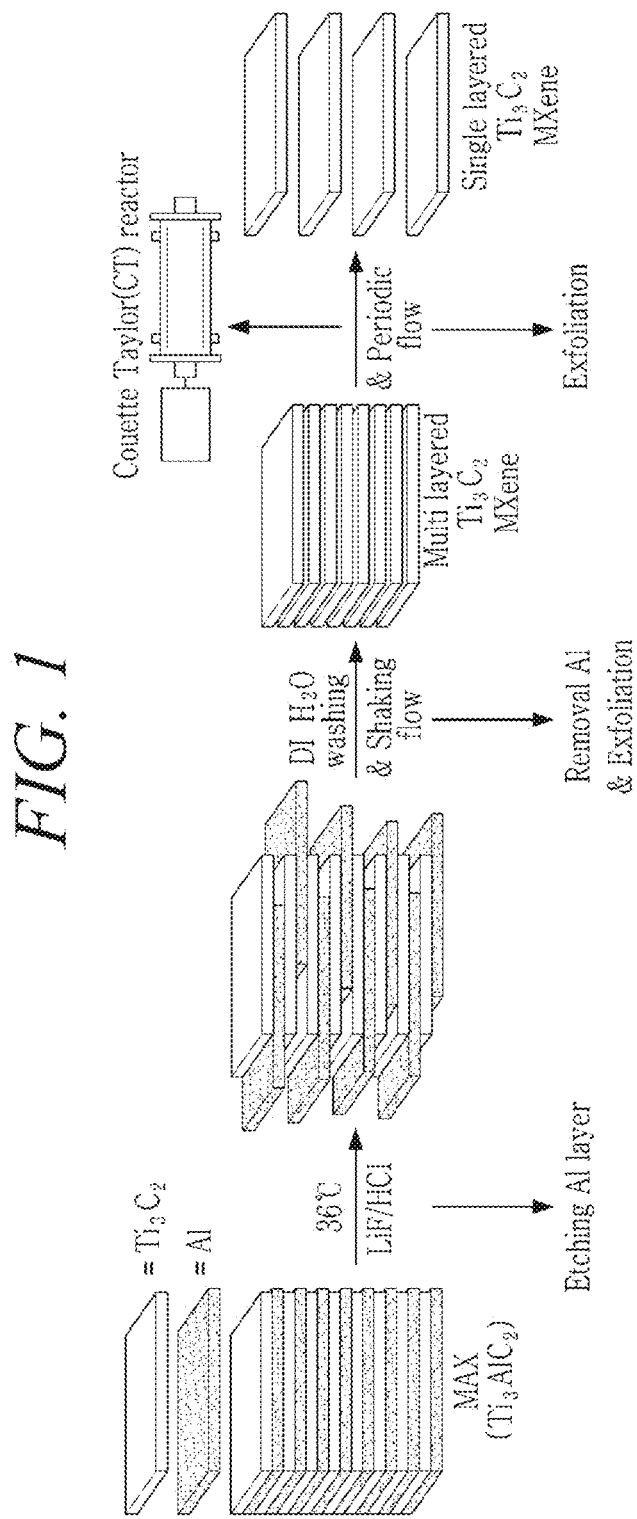
FIG. 1 is a schematic diagram for explaining a preparation method for single-layered MXenes according to an embodiment of the present disclosure.

Hereinafter, each configuration of the present disclosure will be described in more detail so that those skilled in the art may easily perform the present disclosure, but this is merely an example, and the scope of the present disclosure is not limited to the following.

In this specification, 'regular flow induced by Couette-Taylor reactor' comprises any one selected from the group consisting of the laminar Couette flow, laminar Taylor vortex flow, wavy-vortex flow, doubly periodic wavy-vortex flow and weakly turbulent vortices flow according to the following table 1.

TABLE 1

| | |
|---|---|
| $Ta/Ta_c < 1$ | Laminar Couette flow |
| $1 < Ta/Ta_c < 9$ | Laminar Taylor vortex flow |
| $9 < Ta/Ta_c < 176.89$ | wavy-vortex flow |
| $176.89 < Ta/Ta_c < 324$ | Doubly periodic wavy-vortex flow |
| $324 < Ta/Ta_c < 1089$ | weakly turbulent vortices flow |
| $1089 < Ta/Ta_c < 25600$ | Turbulent vortices flow |
| $Ta/Ta_c > 25600$ | Turbulent flow |

1. Taylor number $(Ta) = \text{Re}\left(\dfrac{d}{ri}\right)$

Reynolds number $(\text{Re}) = \left(\dfrac{wrid}{v}\right)$ w = angular velocity of the inner cylinder
ri = radius of inner cylinder
v = kinematic viscosity of fluid
d = gap between inner cylinder and outer cylinder 2. Critical Taylor number($Ta_c$) is determined by η(ri/ro). When η is determined, the Critical Taylor number($Ta_c$) is determined by "experiments on the stability of viscous flow between rotating cylinders finite-amplitude experiment, R.J. Donnelly and K.W. Schwarz, Proc. R. Soc. Lond. A 1965, 283, 531-556".
ri = radius of inner cylinder
ro = radius of outer cylinder One embodiment of the present disclosure provides a preparation method for single-layer MXenes, the method includes exfoliating a single layer of MXenes from multi-layered MXenes with a Couette-Taylor reactor (CT reactor), inducing a regular flow. According to an embodiment of the present disclosure, it is possible to solve the problem that it is difficult to exfoliate a single layer of MXenes from multi-layered MXenes by conventional irregular stirring flow or ultrasonic wave treatment and to increase the yield of the single-layered MXenes without physically fragmenting the multi-layered MXenes.

1. Preparation Method for Single-Layered MXenes

A Preparation method for single-layered MXenes includes exfoliating a single layer of MXenes from multi-layered MXenes with a Couette-Taylor reactor (CT reactor) inducing a regular flow. Specifically, the CT reactor may include an outer cylinder and an inner cylinder having the same central axis and different radius. When the inner cylinder rotates, the fluid flows in the rotational direction, and the fluid existing on the inner cylinder side is forced to go out in the direction of the outer cylinder by centrifugal force and Coriolis force. Due to this, as the rotational speed of the inner cylinder increases, the fluids present on the inner cylinder become more unstable, forming a vortex of a ring pair arrangement that is regular along the axial direction and rotates in opposite directions.

A conventional preparation method for single-layered MXenes, the method including: etching off an atomic layer from the MAX; removing the atomic layer from the etched MAX using stirring flow, etc., and exfoliating the multi-layered MXenes; exfoliating the single-layered MXenes from the multi-layered MXenes using ultrasonic waves or stirring flow, etc., was mainly used. However, in the case of ultrasonic wave treatment, there was a problem in that the multi-layered MXenes were fragmented due to high output energy, and in the case of stirring flow, non-exfoliated multi-layered MXenes increased due to irregular flow, so the yield of single-layer Mxenes was low. According to an embodiment of the present disclosure, shear stress may be applied to the multi-layered MXenes through a vortex formed by driving the CT reactor. Such shear stress imparts a force in the opposite direction along the face of the multi-layered MXenes so that each layer of the multi-layered MXenes can be opened more easily, thereby preparing a single-layered MXenes with a high yield.

The inner cylinder may rotate at 30 rpm or more for 5 minutes or more, specifically 300 to 2400 rpm for 5 to 1,440 minutes, more specifically 980 to 2400 rpm for 5 to 50 minutes. When the rotation speed and rotation time (stirring speed and stirring time) of the inner cylinder are less than the above numerical ranges, the single-layered MXenes may not be sufficiently separated from the multi-layered MXenes, resulting in a problem in that the yield of the single-layered MXenes is lowered.

The preparation method for multi-layered MXenes, according to the present disclosure, may comprise a first step of etching off an atomic layer from the Max.

The Max may be a compound represented by the following Formula 1.

$$M_{n+1}AX_n \quad \text{[Formula 1]}$$

In Formula 1, M may be a transition metal, A may be any one selected from Group 12 to Group 16 elements, X may be carbon or nitrogen, and n may be 1 to 4. More specifically, in Formula 1, M may be any one selected from the group consisting of Sc, Lu, Ti, Zr, Hf, V, Nb, Ta, Cr, Mo, Mn, Hb, and Co, and A may be any one selected from the group consisting of Cd, Al, Ga, In, Tl, Si, Ge, Sn, Pb, P, As, and S.

The Max may be, for example, $Ti_2CdC$, $Sc_2InC$, $Ti_2AlC$, $Ti_2GaC$, $Ti_2InC$, $Ti_2TlC$, $V_2AlC$, $V_2GaC$, $Cr_2GaC$, $Ti_2AlN$, $Ti_2GaN$, $Ti_2InN$, $V_2GaN$, $Cr_2GaN$, $Ti_2GeC$, $Ti_2SnC$, $V_2GeC$, $Cr_2AlC$, $Cr_2GeC$, $V_2PC$, $V_2AsC$, $Ti_2SC$, $Zr_2InC$, $Zr_2TlC$, $Nb_2AlC$, $Nb_2GaC$, $Nb_2InC$, $Mo_2GaC$, $Zr_2InN$, $Zr_2TlN$, $Zr_2SnC$, $Zr_2PbC$, $Nb_2SnC$, $Nb_2PC$, $Nb_2AsC$, $Zr_2SC$, $Nb_2SC$, $Hf_2InC$, $Hf_2TlC$, $Ta_2AlC$, $Ta_2GaC$, $Hf_2SnC$, $Hf_2PbC$, $Hf_2SnN$, $Hf_2SC$; $Ti_3AlC_2$, $V_3AlC_2$, $Ti_3SiC_2$, $Ti_3GeC_2$, $Ti_3SnC_2$, $Ta_3AlC_2$; $Ti_4AlN_3$, $V_4AlC_3$, $Ti_4GaC_3$, $Ti_4SiC_3$, $Ti_4GeC_3$, $Nb_4AlC_3$, $Ta_4AlC_3$, or the like. However, the technical spirit of the present disclosure is not limited thereto, and all types of MAX may be applied.

The first step may include preparing a first solution in which lithium fluoride and hydrochloric acid are mixed and stirring a MAX suspension in which the MAX is added to the first solution. The first step may be a step of generating hydrofluoric acid in-situ using hydrochloric acid (HCl) and lithium fluoride (LiF) without directly using hydrofluoric acid. Accordingly, the generated lithium ions (Li$^+$) may facilitate exfoliating the multi-layered MXenes from the atomic layer etched MAX using only a shaking flow. In this method, the problem of MXenes defects occurring when the concentration of hydrofluoric acid is increased may be solved by reducing the amount of hydrofluoric acid. In addition, it is possible to reduce the number of fluorine-containing functional groups that can be generated by hydrofluoric acid.

The stirring of the MAX suspension may use any one selected from the group consisting of a Rushton turbine agitator, a magnetic stirrer, and a combination thereof.

The step of using the Rushton turbine agitator may be a step of stirring the MAX suspension at 1000 rpm or more for 5 hours or more, and specifically, may be a step of stirring the MAX suspension at 1500 to 3000 rpm for 5 to 24 hours. When the stirring speed and stirring time of the step of using the Rushton turbine agitator are less than the above numerical ranges, the atomic layer may not be effectively etched from the layered structure MAX, and thus the content of unreacted MAX increases, resulting in the yield of single-layered MXenes may be lowered.

The step of using the magnetic stirrer may be a step of stirring the MAX suspension at 300 rpm or more for 20 hours or more, and specifically, may be a step of stirring the MAX suspension at 300 to 800 rpm for 20 to 24 hours. When the stirring speed and stirring time of the step of using the magnetic stirrer are less than the above numerical ranges, the atomic layer may not be effectively etched from the layered structure MAX, and thus the content of unreacted MAX increases, resulting in the yield of single-layered MXenes may be lowered.

The preparation method for multi-layered MXenes, according to the present disclosure, may further include a second step of stirring the mixture in which the atomic layer etched MAX are mixed with deionized water. Specifically, by stirring the mixture in which the atomic layer etched MAX is mixed with deionized water, the etched atomic layer, acids, salts generated after the reaction, and other ions dissolved in deionized water, may be removed. The second step may be, for example, a step of using any one method selected from the group consisting of a hand shaking method, a magnetic stirring method, and a combination thereof.

Hereinafter, the configuration of the present disclosure will be described in more detail with reference to FIGS. 1 and 2.

FIG. 1 is a schematic diagram for explaining a preparation method for single-layered MXenes according to an embodiment of the present disclosure.

Referring to FIG. 1, a preparation method for single-layered MXenes according to an embodiment of the present disclosure includes: (a) etching off an atomic layer (AL layer) from MAX ($Ti_3AlC_2$), which is a layered structure; (b) obtaining multi-layered MXenes by shaking the mixture of the atomic layer etched MAX and deionized water; and (c) exfoliating off the single-layered MXenes from the multi-layered MXenes using a CT reactor. Specifically, in step (b), after shaking a mixture of the atomic layer etched MAX and deionized water, the etched atomic layer, and other ions may be removed using a centrifuge. In some cases, larger volumes can be washed at one time if a large-capacity centrifuge is used.

Figure 2:
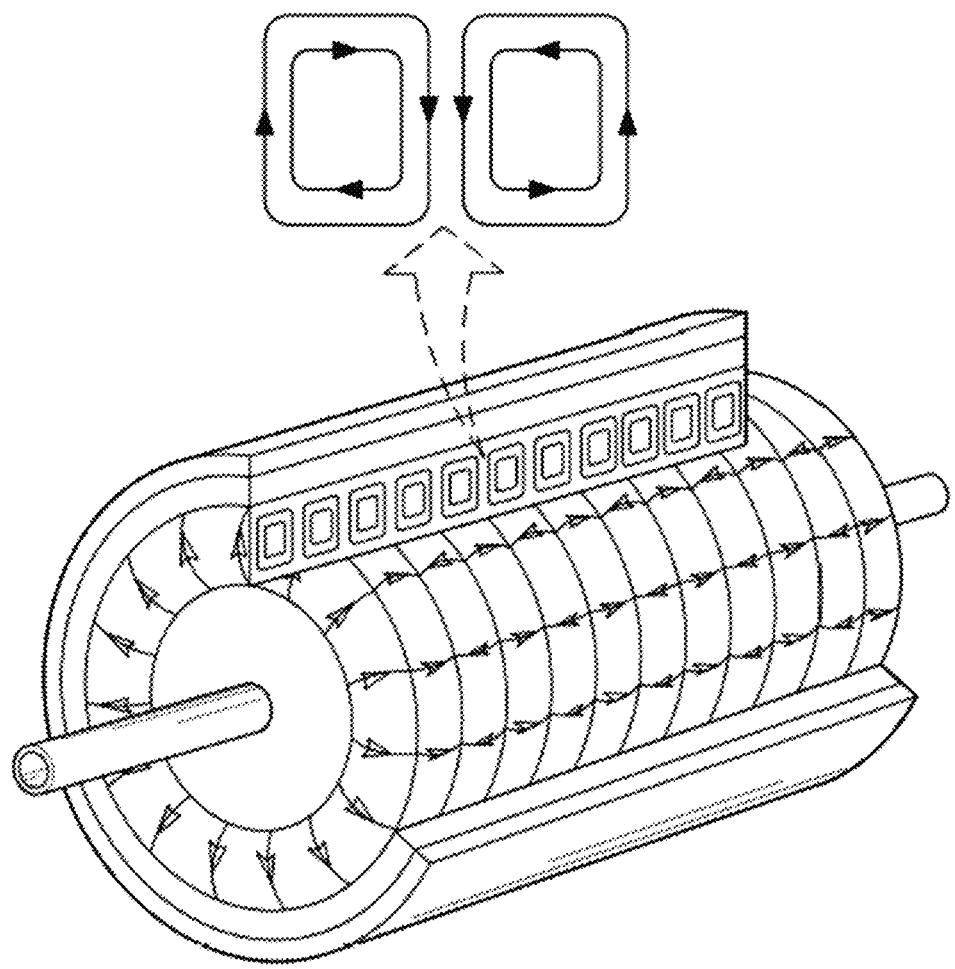
FIG. 2 shows a CT reactor used to exfoliate a single layer of MXenes from multi-layered MXenes.

FIG. 2 shows a CT reactor used to exfoliate a single layer of MXenes from multi-layered MXenes.

Referring to FIG. 2, the CT reactor may include an outer cylinder and an inner cylinder having the same central axis and different radius. When the inner cylinder rotates, the fluid flows in the rotational direction, and the fluid existing on the inner cylinder side is forced to go out in the direction of the outer cylinder by centrifugal force and Coriolis force. Due to this, as the rotational speed of the inner cylinder increases, the fluids present in the inner cylinder become more unstable, forming a vortex of a ring pair arrangement that is regular along the axial direction and rotates in opposite directions. According to an embodiment of the present disclosure, a vortex formed by driving a CT reactor may apply shear stress to the multi-layered MXenes. These shear stresses apply forces in opposite directions along the surface of the multi-layered MXenes, making it easier for each layer of the multi-layered MXenes to open up and manufacture high-yield single-layered MXenes.

The CT reactor, according to an embodiment of the present disclosure, may be manufactured by appropriately adjusting the radius of the outer cylinder and the radius of the inner cylinder, the gap between the inner cylinder and the outer cylinder, and the cylinder length of the inner cylinder. For example, the CT reactor used in Experimental Examples 1 to 3 herein has an inner cylinder radius of 2.3 cm, an outer cylinder radius of 2.45 cm, a gap between the inner cylinder and the outer cylinder of 1.5 mm, and an inner cylinder length of 9 cm, and the CT reactor used in Experimental Examples 4 to 6 below has an inner cylinder radius of 4.005 cm, an outer cylinder radius of 4.09 cm, a gap between the inner and outer cylinders of 0.85 mm, and the inner cylinder length of 12 cm.

2. Application of Single-Layered MXenes

Another embodiment of the present disclosure may provide single-layered MXenes prepared by the preparation method for the single-layered MXenes.

Still another embodiment of the present disclosure may provide a thin film for shielding electromagnetic wave, including the single-layered MXenes. The single-layered MXenes prepared by the preparation method for the single-layered MXenes, according to the present disclosure, is lighter and less expensive than metal, and since a flexible printing process is possible, thereby being applied as an electromagnetic wave shielding material that can surpass existing metals. Accordingly, when the single-layered MXenes, according to the present disclosure, is used, it is possible to solve a problem that metal is difficult to apply to flexible printing process due to heavy and irregular structure.

Still another embodiment of the present disclosure may provide an electrode including the single-layered MXenes. Like graphene used as a general electrode candidate material, the single-layer MXenes have a very large specific surface area compared with a volume, excellent electrical conductivity, and mechanical and chemical stability, and thus may be applied to an electrode. In particular, the electrical conductivity of single-layered MXenes may correspond to 10 times or more compared to graphene.

Hereinafter, the embodiment of the present disclosure will be described in detail so that those skilled in the art may easily implement the present disclosure, but this is merely an example, and the scope of the present disclosure is not limited to the following.

Preparation of Example 1: Preparation of Materials

MAX ($Ti_3AlC_2$; 99%) was purchased from Avention Inc., hydrochloric acid (35.0% to 37.0%) was purchased from Samchun Pure Chemical Industries, Ltd., and lithium fluoride (98.5%) was purchased from Alfa Aesar. All chemicals and materials were used in this study without further purification.

Preparation Example 1: Preparation Method for Single-Layered Mxenes

Example 1-1

Preparation of Single-Layered MXenes Using CT Reactor (a) Step: Etching Off an Atomic Layer from the MAX;

Put ethanol (400 mL) and ice (400 g) together in an evaporation beaker to lower the temperature of ethanol to room temperature or less. Add hydrochloric acid (9 M; 310 mL) and a magnetic bar to a Teflon beaker (500 mL). In order to lower the reaction temperature, the Teflon beaker is placed in an evaporation beaker with ethanol, and then lithium fluoride (15.7356 g) is slowly added while mixing hydrochloric acid with a magnetic stirrer at 500 to 510 rpm. When the solution in which lithium fluoride was completely dissolved in hydrochloric acid became transparent, MAX ($Ti_3AlC_2$; 15.656 g) was slowly added to this solution over 5 to 10 minutes to prepare a MAX suspension. After fixing a Rushton turbine agitating reactor with baffles in an oil bath stabilized at 36° C., the MAX suspension was put into the Rushton turbine agitated reactor and stirred at 2,000 rpm for 11 hours to etch an atomic layer (aluminum layer).

(b) Step: (a) Preparing Multi-Layered MXenes by Washing the Resultant;

The resultant (suspension) of step (a) is separated into 10 mL, and each of them is put into a 50 mL falcon tube for washing. Here, in order to wash and remove the etched alumina and acid, salts produced after the reaction, and ions, deionized water (20 mL; deionized water) was added to the resultant of step (a) and shaken by hand for 5 minutes. Thereafter, centrifugation was performed at 3,500 rpm for 5 minutes using a centrifuge to remove a supernatant containing etched alumina, acid, and salts, and ions produced after the reaction. This process was repeated until the pH reached 6 or higher to obtain a 'multi-layered MXenes suspension prepared by shaking flow'.

(c) Step: Preparing a Single-Layered MXenes Using a CT Reactor;

The multi-layered MXenes suspension prepared by the shaking flow obtained in step (b) was put into a Couette-Taylor reactor (CT reactor), and then stirred at a stirring speed of 2,400 rpm (rotation speed of the inner cylinder) for 50 minutes to obtain a single-layered MXenes.

Examples 1-2 to 1-4

Unlike Example 1-1, When the Stirring Speed of the CT Reactor was Changed

Single-layered MXenes were prepared in the same manner as in Example 1-1, but in step (c), 2,400 rpm of the stirring speed of the CT reactor was changed to 433 rpm (Example 1-2), 980 rpm (Example 1-3), and 1,750 rpm (Examples 1-4), respectively.

Examples 2-1 to Example 2-4

Unlike Example 1-1, When the Stirring Time was Changed

Single-layered MXenes were prepared in the same manner as in Example 1-1, but in step (c), 50 minutes, which is the stirring time of the CT reactor, were changed to 10 minutes (Example 2-1), 20 minutes (Example 2-2), 30 minutes (Example 2-4), and 40 minutes (Example 2-4), respectively.

Examples 3-1 and 3-2

Unlike Example 1-1, When Using a Magnetic Stirrer Instead of the Rushton Turbine Agitated Reactor in Step (a)

Single-layered MXenes were prepared in the same manner as in Example 1-1, but the atomic layer was etched in MAX using a magnetic stirrer instead of the Rushton turbine agitated reactor in step (a), and the stirring speed of the CT reactor in step (c) was changed to 700 rpm (Example 3-1) and 1,200 rpm (Example 3-2), respectively (stirring time: 50 minutes).

Etching off an atomic layer from the MAX using the magnetic stirrer is as follows. Put ethanol (400 mL) and ice (400 g) together in an evaporation beaker to lower the temperature of ethanol to room temperature or less. To lower the reaction temperature, place a propylene beaker (30 mL) with hydrochloric acid (9 M; 10 mL) and a magnetic bar in an evaporation beaker with ethanol. Lithium fluoride (0.5076 g) is slowly added to the inside of the propylene beaker while mixing the hydrochloric acid with the lowered temperature with a magnetic stirrer at 500 to 510 rpm. When lithium fluoride is completely dissolved in hydrochloric acid, and the solution becomes transparent, MAX (Ti$_3$AlC$_2$; 0.505 g) is slowly added to this solution over 5 minutes to prepare a Max suspension. Place the MAX suspension in an oil bath stabilized at 36° C. and reacted for 24 hours while mixing at 500 to 510 rpm.

Comparative Example 1-1

Unlike Example 1-1, Rushton Turbine Agitated Reactor was Used Instead of CT Reactor MXenes were prepared in the same manner as in Example 1-1, but instead of the CT reactor, the multi-layered MXenes suspension obtained in step (b) was injected into the Rushton turbine agitated reactor and stirred at a stirring speed of 2,000 rpm for 50 minutes. By processing for 50 minutes at the stirring speed of 2,000 rpm in the Rushton turbine agitated reactor, the same shear stress as that of Examples 1-4 (CT reactor; 1750 rpm, 50 minutes) was induced.

Comparative Example 1-2

MXenes Prepared by Ultrasonic Exfoliating Method

MXenes were prepared in the same manner as in Example 3-1, but in the resultant (10 mL) produced by mixing the MAX suspension put in an oil bath stabilized at 36° C. at 500 to 510 rpm for 24 hours, ultrasonic waves of 42 kHz and 100 W were treated for 5 minutes using Branson 3510 from BRANSON Ultrasonic, Co. In Example 3-1, shaking by hand for 5 minutes was replaced with treating the ultrasonic wave for 5 minutes, and the step (c) (the step of using a CT reactor) was omitted.

Experimental Example 1

TEM Photographs of Comparative Examples 1-1 and 1-4

Figure 3A:
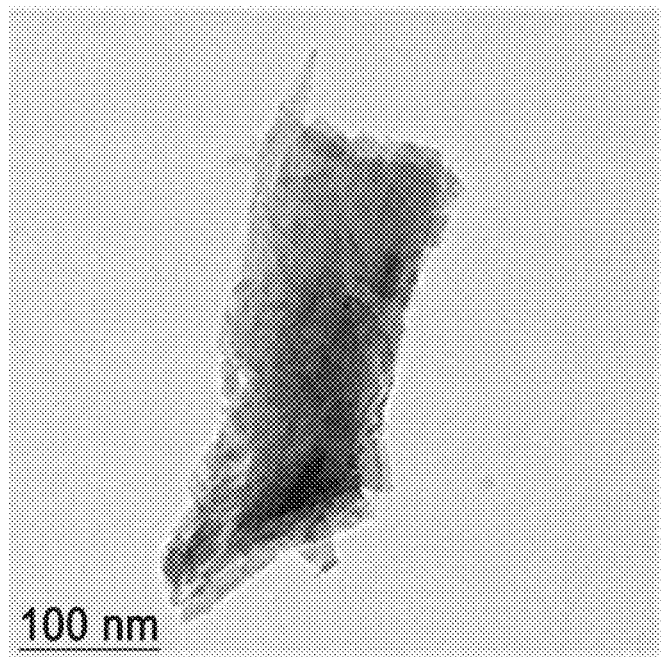
FIG. 3A shows a transmission electron microscopy (TEM) photograph of MXenes in Comparative Example 1-1.
Figure 3A:
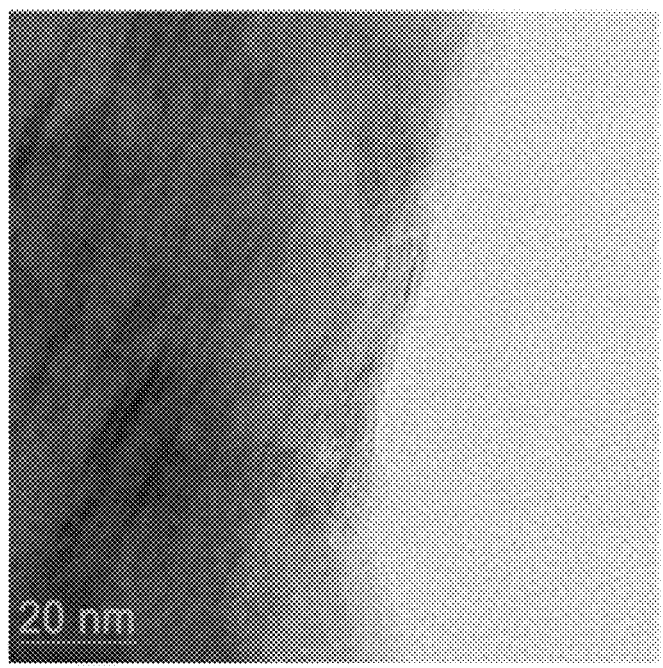
Figure 3B:
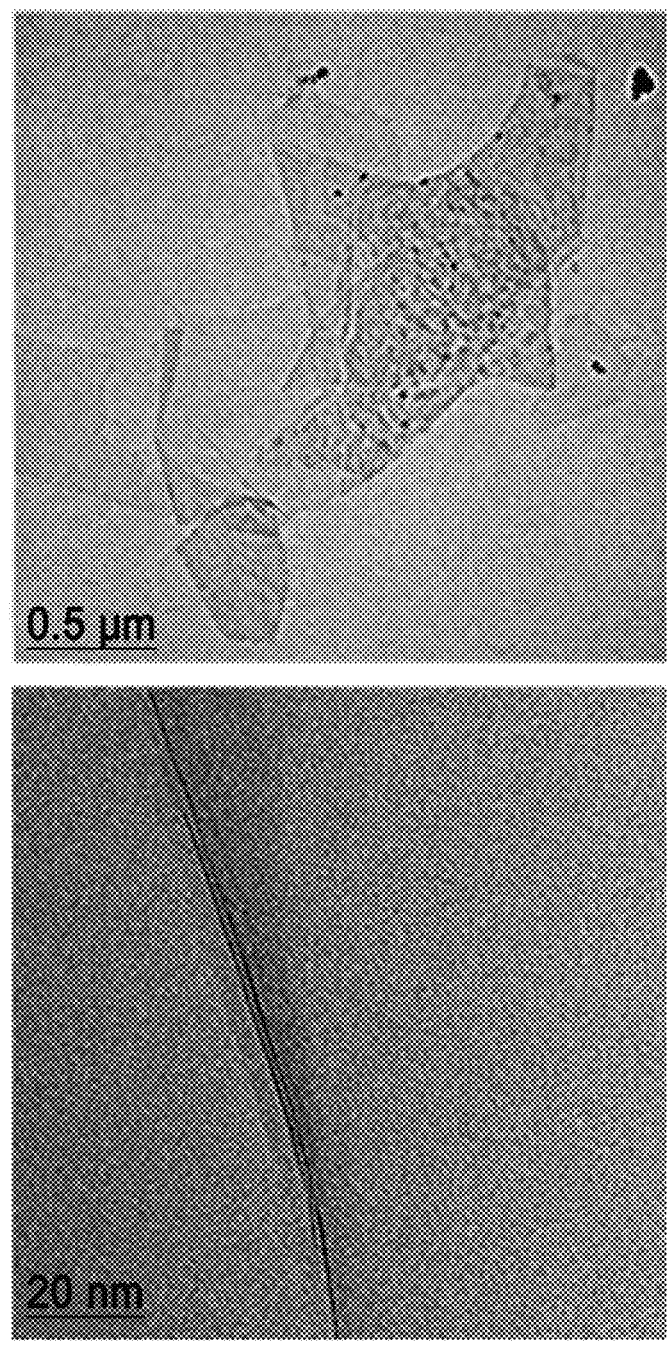
FIG. 3B shows a transmission electron microscopy (TEM) photograph of MXenes in Example 1-4.

FIG. 3A shows a transmission electron microscopy (TEM) photograph of MXenes in Comparative Example 1-1. FIG. 3B shows a transmission electron microscopy (TEBM) photograph of MXenes in Example 1-4.

Referring to FIGS. 3A and 3B, when the single-layered MXenes are exfoliated in a Rushton turbine agitated reactor having an irregular flow as in Comparative Example 1-1, it can be confirmed that the exfoliating of the single-layered MXenes from the multi-layered MXenes did not proceed any further due to the irregular flow. On the other hand, when using a CT reactor that induces high shear stress and has a regular flow as in Examples 1-4, it can be confirmed that the single-layered MXenes are efficiently exfoliated from the multi-layered MXenes without physical fragmenting of the multi-layered MXenes.

Experimental Example 2

Figure 4A:
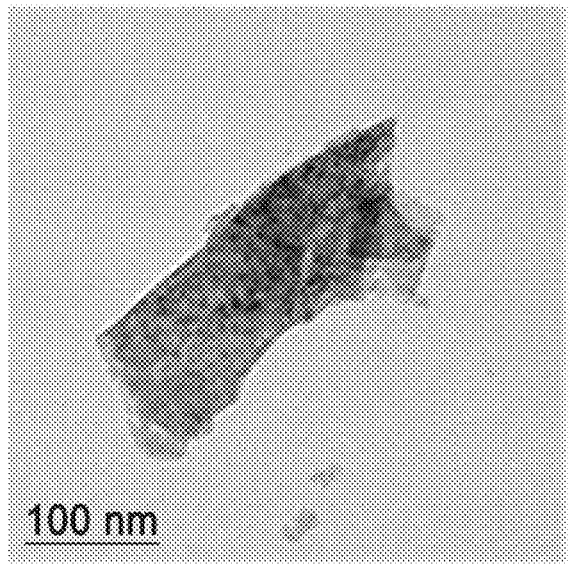
FIG. 4A shows a TEM photograph of single-layered MXenes prepared using multi-layered MXenes suspension prepared by shaking flow.
Figure 4A:
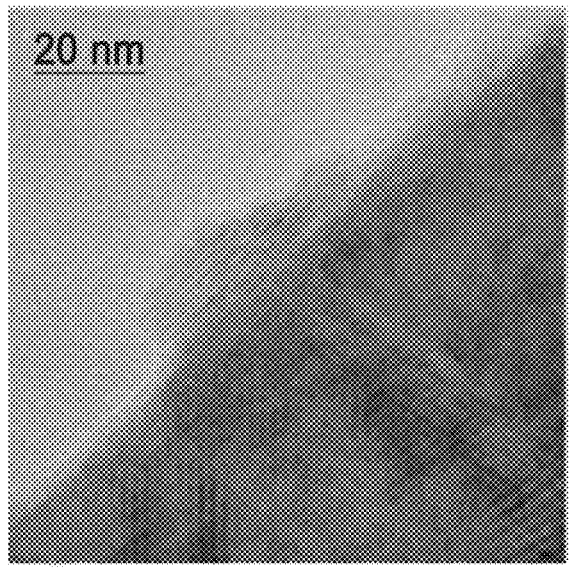
Figure 4B:
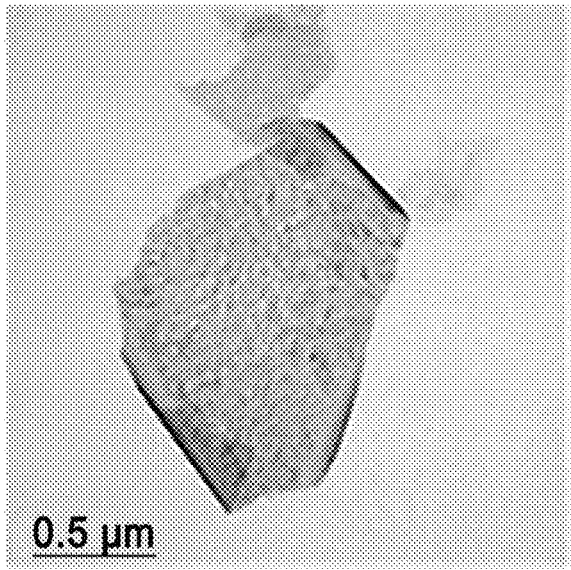
FIG. 4B shows a TEM photograph of single-layered MXenes prepared by the method according to Example 1-2.
Figure 4B:
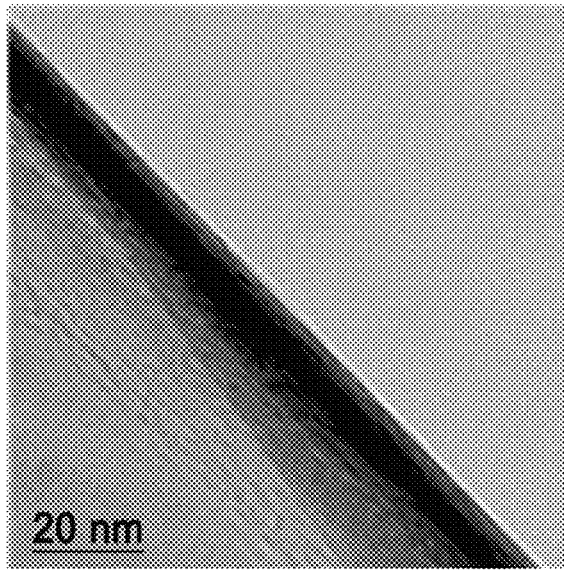
Figure 4C:
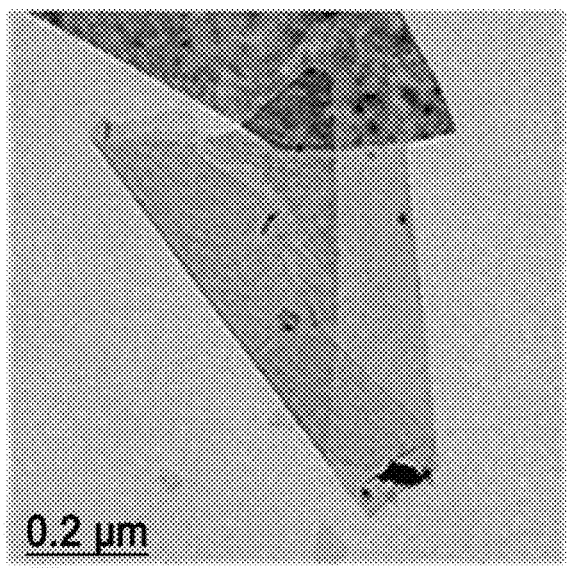
FIG. 4C shows a TEM photograph of single-layered MXenes prepared by the method according to Example 1-3.
Figure 4C:
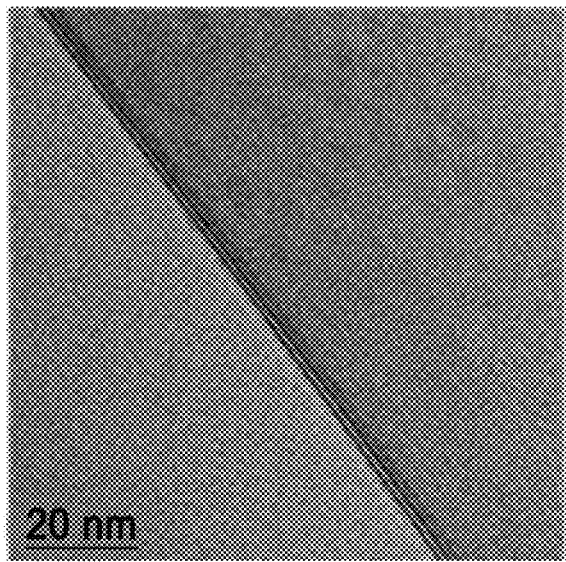
Figure 4D:
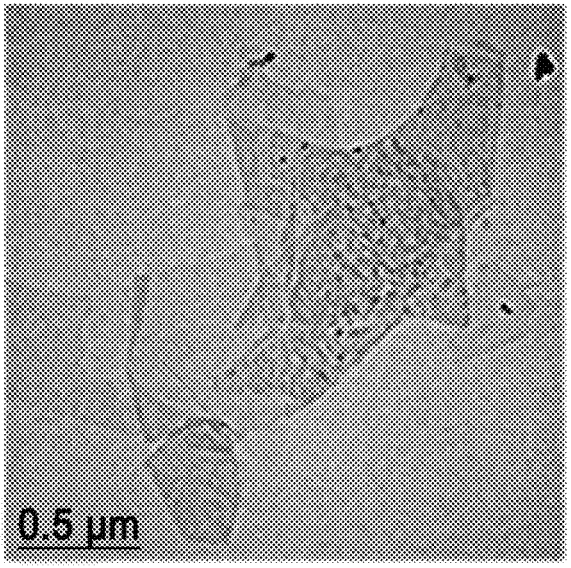
FIG. 4D shows a TEM photograph of single-layered MXenes prepared by the method according to Example 1-4.
Figure 4D:
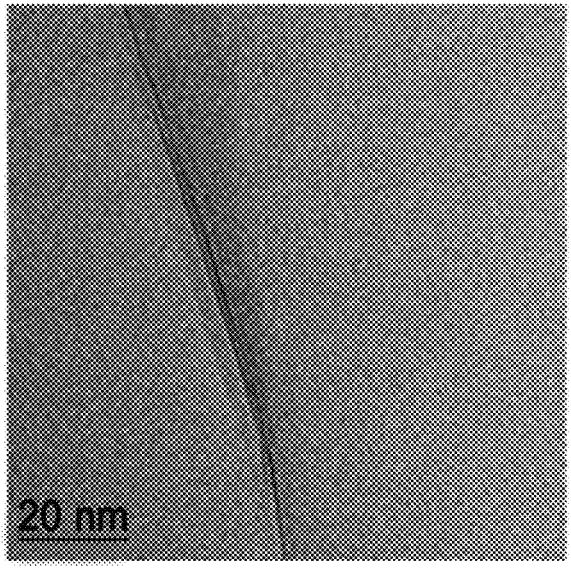
Figure 4E:
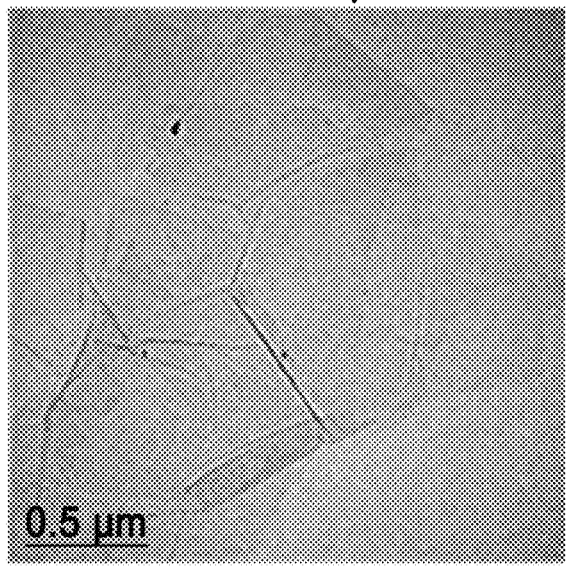
FIG. 4E shows a TEM photograph of single-layered MXenes prepared by the method according to Example 1-5.
Figure 4E:
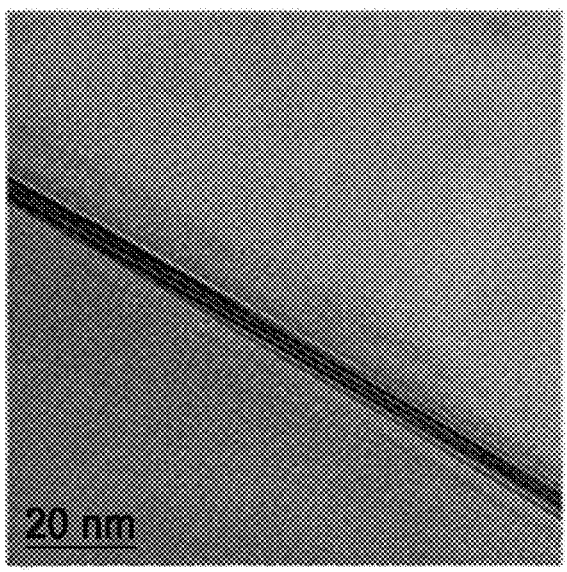

Evaluation of Exfoliating Degree of Single-Layered MXenes According to Shear Stress FIG. 4A shows a TEM photograph of single-layered MXenes prepared using multi-layered MXenes suspension prepared by shaking flow. FIG. 4B shows a TEM photograph of single-layered MXenes prepared by the method according to Example 1-2. FIG. 4C shows a TEM photograph of single-layered MXenes prepared by the method according to Example 1-3. FIG. 4D shows a TEM photograph of single-layered MXenes prepared by the method according to Example 1-4. FIG. 4B shows a TEM photograph of single-layered MXenes prepared by the method according to Example 1-5.

Referring to FIGS. 4A to 4E, when using the shear stress of the regular flow induced in the CT reactor as in Examples 1-1 to 1-4, compared to the multi-layered MXenes suspension prepared by the shaking flow, it can be inferred that single-layered MXenes can be exfoliated in high yield from multi-layered MXenes without physical fragmenting of the multi-layered MXenes. Specifically, it can be inferred that the yield of single-layered MXenes increases as the stirring speed of the CT reactor increases.

Experimental Example 3

Figure 5A:
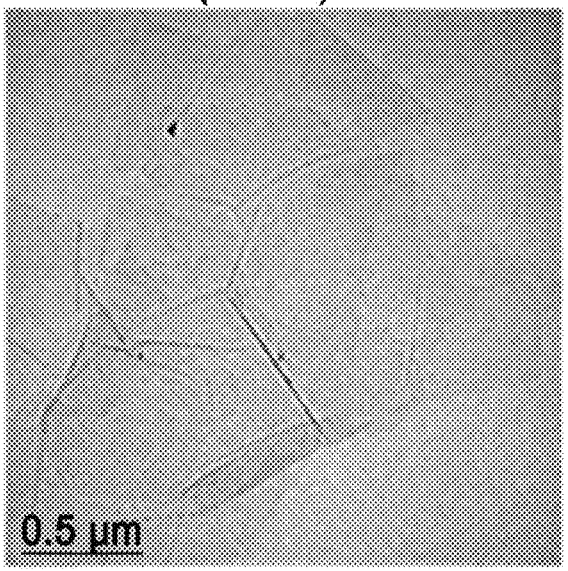
FIG. 5A shows a TEM photograph of single-layered MXenes prepared by the method according to Example 2-1.
Figure 5A:
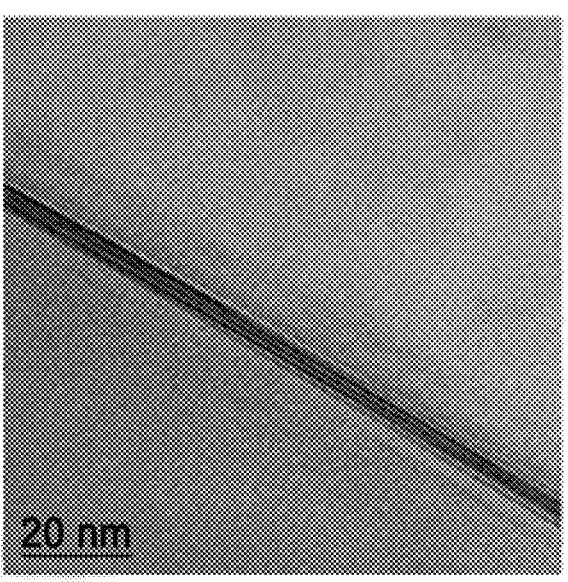
Figure 5B:
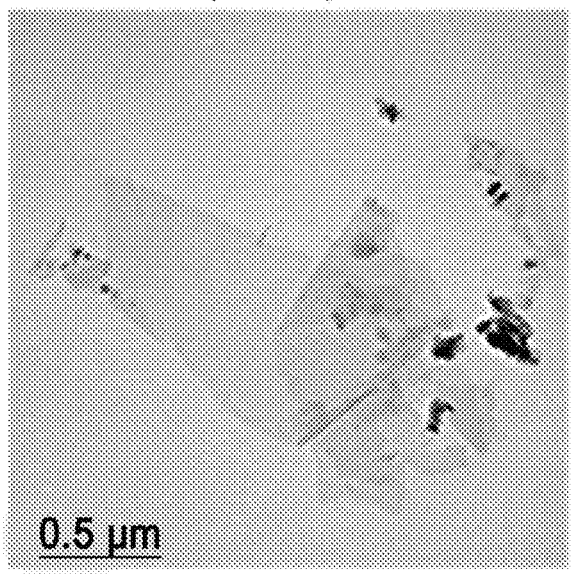
FIG. 5B shows a TEM photograph of single-layered MXenes prepared by the method according to Example 2-2.
Figure 5B:
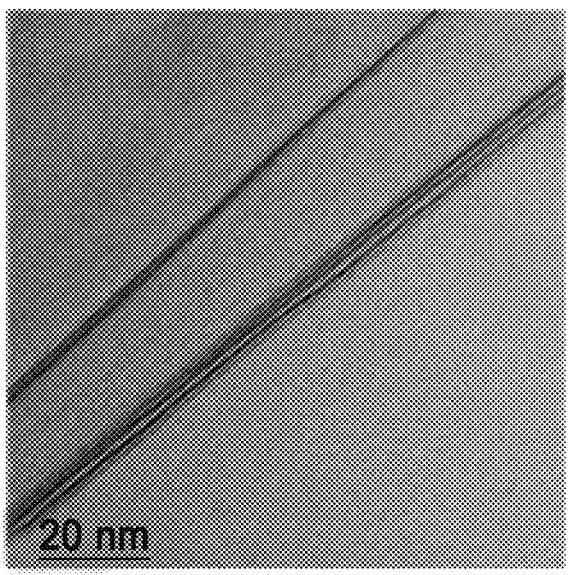
Figure 5C:
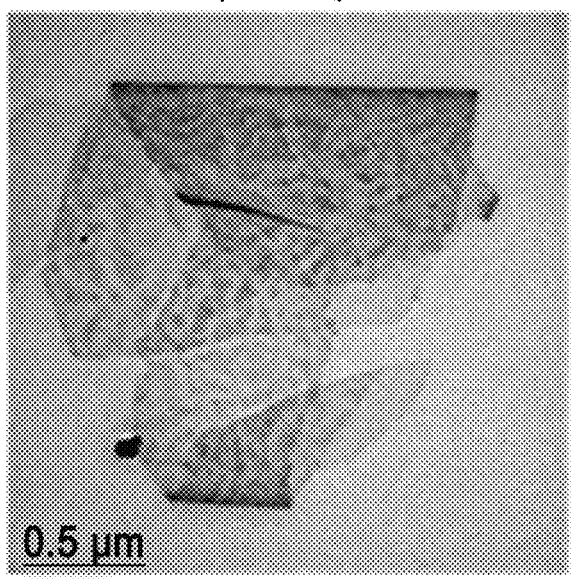
FIG. 5C shows a TEM photograph of single-layered MXenes prepared by the method according to Example 2-3.
Figure 5C:
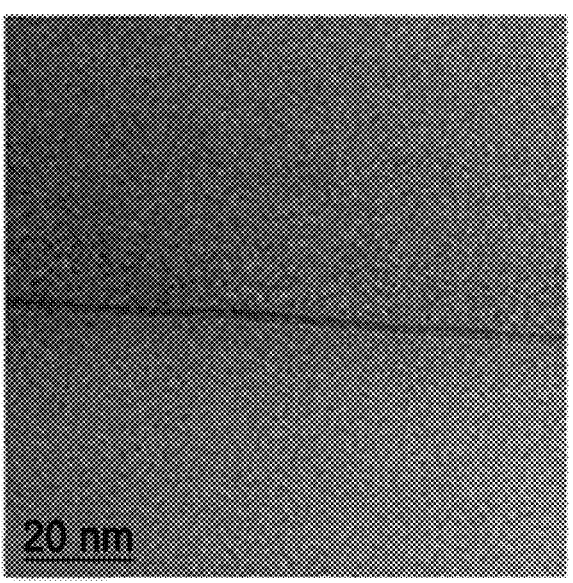
Figure 5D:
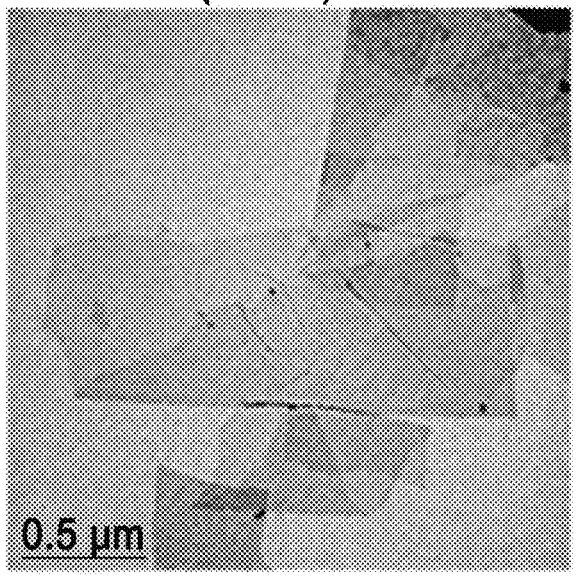
FIG. 5D shows a TEM photograph of single-layered MXenes prepared by the method according to Example 2-4.
Figure 5D:
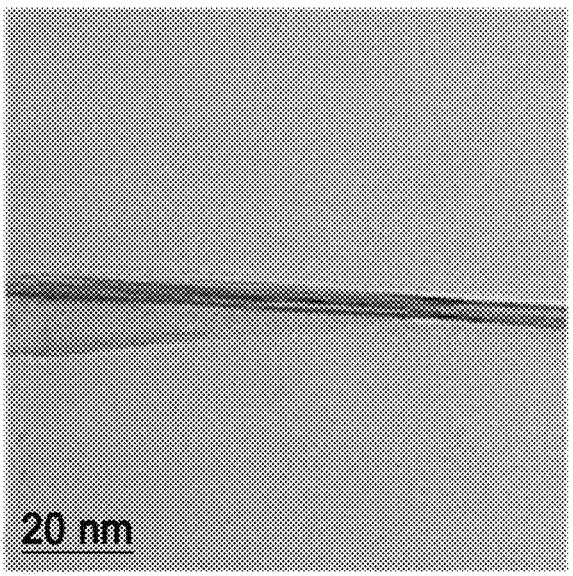
Figure 5E:
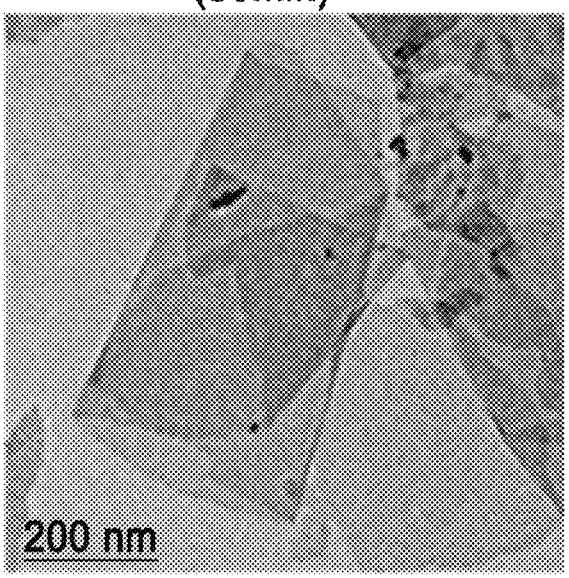
FIG. 5E shows a TEM photograph of single-layered MXenes prepared by the method according to Example 1-1.
Figure 5E:
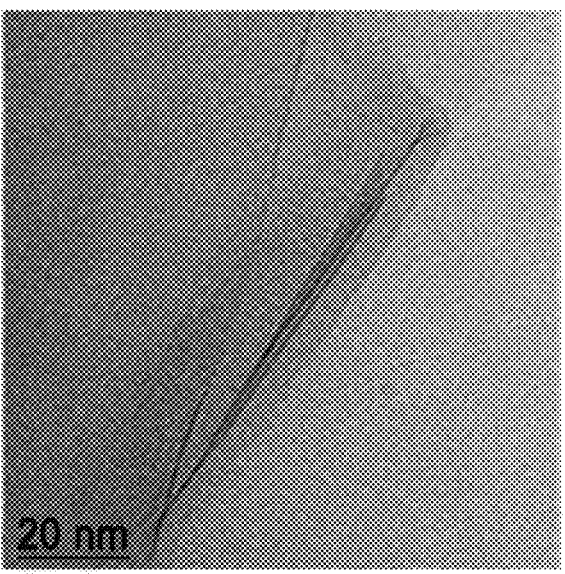

Evaluation of Exfoliating Degree of Single-Layered MXenes According to Stirring Time FIG. 5A shows a TEM photograph of single-layered MXenes produced by the method according to Example 2-1. FIG. 5B shows a TEM photograph of single-layered MXenes produced by the method according to Example 2-2. FIG. 5C shows a TEM photograph of single-layered MXenes prepared by the method according to Example 2-3. FIG. 5D shows a TEM photograph of single-layered MXenes prepared by the method according to Example 2-4. FIG. 5E shows a TEM photograph of single-layered MXenes prepared by the method according to Example 1-1.

Referring to FIGS. 5A to 5E, even when the stirring time of the CT reactor is set to 10 minutes, it can be confirmed that the single-layered MXenes are effectively exfoliated from the multi-layered MXenes. Specifically, it can be inferred that as the stirring time of the CT reactor increases, the yield of the single-layered MXenes exfoliated from the multi-layered MXenes increases.

Experimental Example 4

Separation Experiment of Unreacted MAX Using X-ray Diffraction Analyzer

Figure 6A:
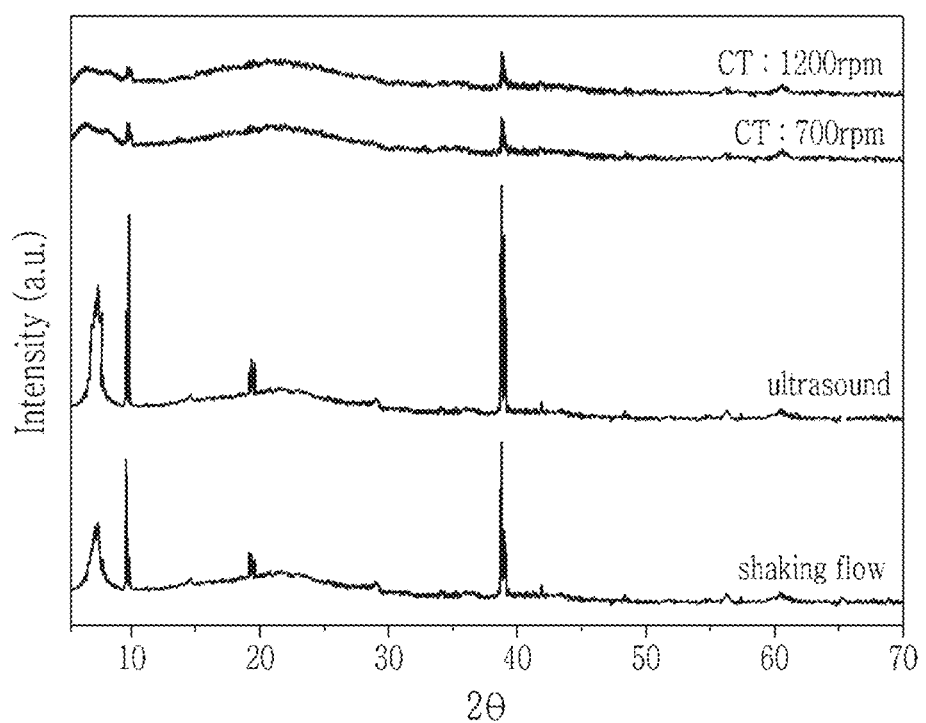
FIG. 6A shows the X-ray results of each MXenes included in the product prepared by the method according to Example 3-1 (CT; 700 rpm), Example 3-2 (CT; 1,200 rpm), and Comparative Example 1-2 (ultrasonic) and a multi-layered MXenes suspension prepared with a shaking flow.
Figure 6B:
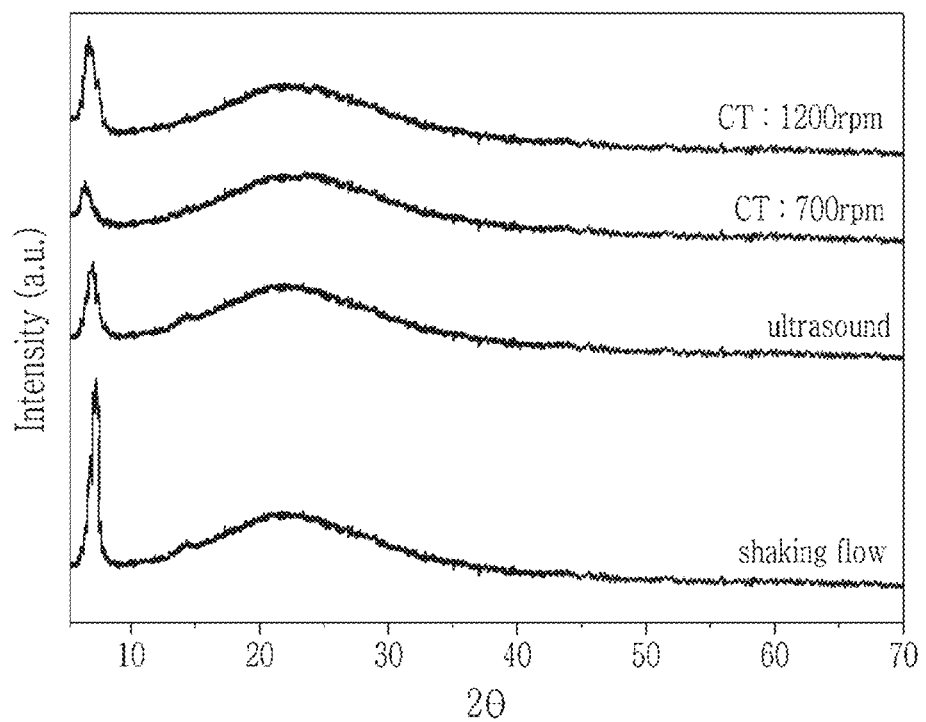
FIG. 6B shows the X-ray result of the product from which unreacted MAX is removed after an additional treatment method using a centrifuge is performed to the product of FIG. 6A.

FIG. 6A shows the X-ray results of each MXenes included in the product prepared by the method according to Example 3-1 (CT; 700 rpm), Example 3-2 (CT; 1,200 rpm), and Comparative Example 1-2 (ultrasonic) and a multi-layered MXenes suspension prepared with a shaking flow. FIG. 6B shows the X-ray result of the product from which unreacted MAX is removed after an additional treatment method using a centrifuge is performed on the product of FIG. 6A. The X-ray results were analyzed with an X-ray diffraction analyzer (X-Ray Diffraction; Rigaku's Miniflex 600).

Referring to FIG. 6A, it was confirmed that the shaking method, the ultrasonic treatment method, and the method using a CT reactor all showed a peak corresponding to the MAX. Through this, it could be inferred that less etched MAX remained in the product prepared by the method according to Example 3-1 (CT; 700 rpm), Example 3-2 (CT; 1,200 rpm), and Comparative Example 1-2 (ultrasonic) and a multi-layered MXenes suspension prepared with a shaking flow.

In order to remove this unreacted MAX, the product prepared by the method according to Example 3-1 (CT; 700 rpm), Example 3-2 (CT; 1,200 rpm), and Comparative Example 1-2 (ultrasonic treatment), and the multi-layered MXenes suspension prepared by shaking flow were treated at 3,500 rpm for 2 minutes, and then supernatant was obtained. Referring to FIG. 6B, it could be confirmed that the peak corresponding to MAX disappeared by the additional treatment method using the centrifuge, and it could be inferred that MAX was completely removed from the supernatant.

Experimental Example 5

Particle Size Distribution Photograph of the Produced MXenes

Figure 7:
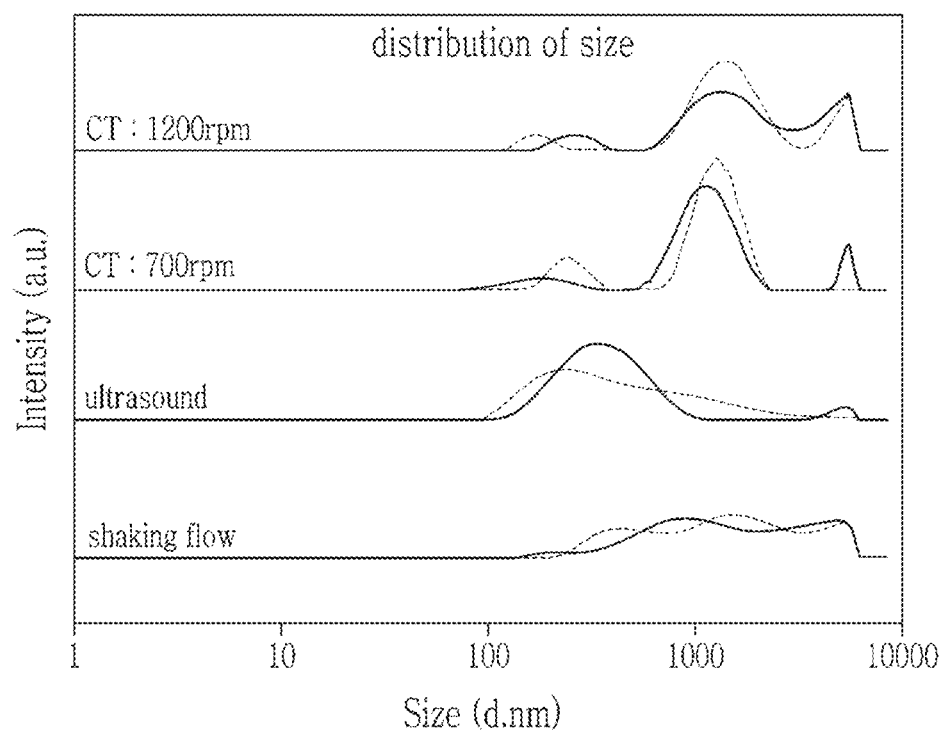
FIG. 7 shows the particle size distribution of each MXenes included in the product prepared by the method according to Example 3-1 (CT; 700 rpm), Example 3-2 (CT; 1,200 rpm), and Comparative Example 1-2 (ultrasonic) and a multi-layered MXenes suspension prepared with a shaking flow.

FIG. 7 shows the particle size distribution of each MXenes included in the product prepared by the method according to Example 3-1 (CT; 700 rpm), Example 3-2 (CT; 1,200 rpm), and Comparative Example 1-2 (ultrasonic) and a multi-layered MXenes suspension prepared with a shaking flow. The particle size distribution of the MXenes was analyzed using a Zetasizer (Nano-zs manufactured by Malvern Panalytical, Co.).

Referring to FIG. 7, when treated in a CT reactor, there was little change in size compared to that in a shaking flow, but it could be inferred that in the case of ultrasonic treatment, the multi-layered MXenes were fragmented by high output energy and the size was reduced to a micro-unit or less. Therefore, it can be inferred that the regular and high shear stress derived from the CT reactor only exfoliates the single-layered MXenes from the multi-layered MXenes and does not cause physical fragmenting of the multi-layered MXenes.

Experimental Example 6

Comparison of Exfoliating Degree of Irregular Flow and Regular Flow by CT Reactor In the method described above in Examples 3-1 and 3-2, a product is obtained by exfoliating off the single-layered MXenes from the multi-layered MXenes by shaking flow after the resultant (10 mL) obtained by etching off an atomic layer from the MAX using the magnetic stirrer was washed with deionized water (hereinafter, referred to as a "shaking flow product") was prepared.

Figure 8A:
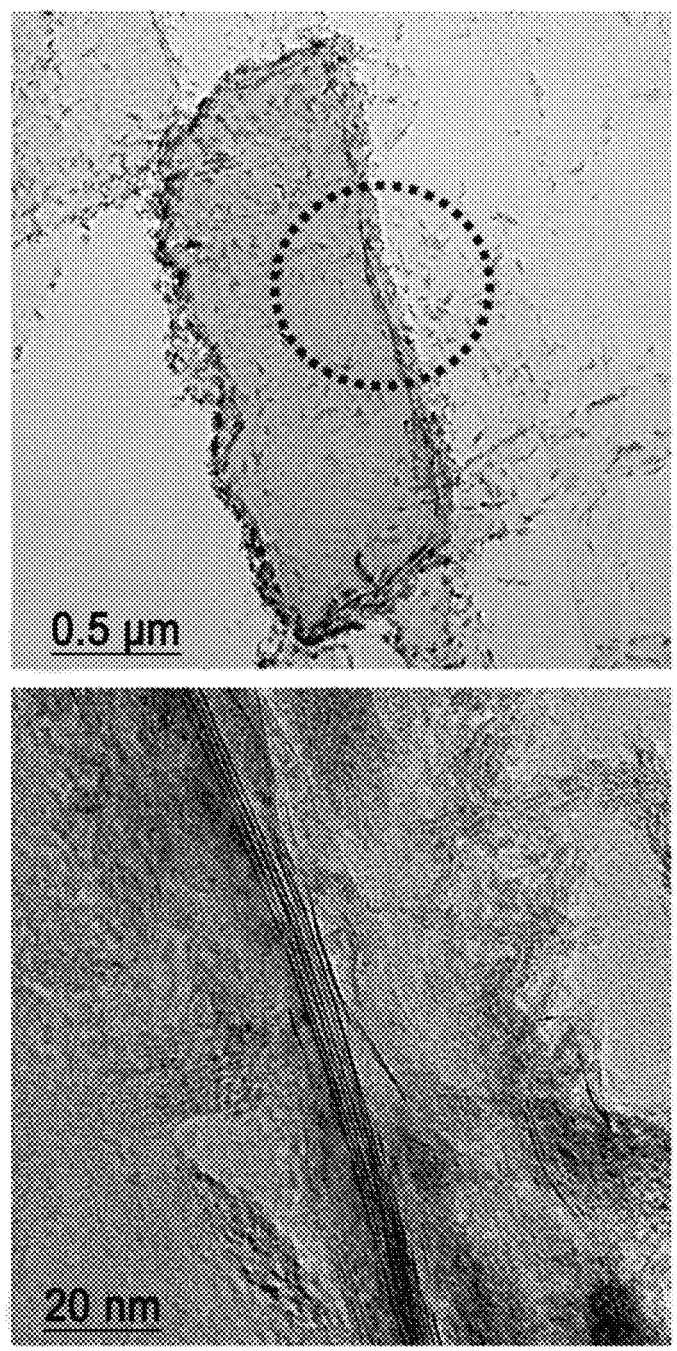
FIG. 8A is a TEM photograph of the shaking flow product.
Figure 8B:
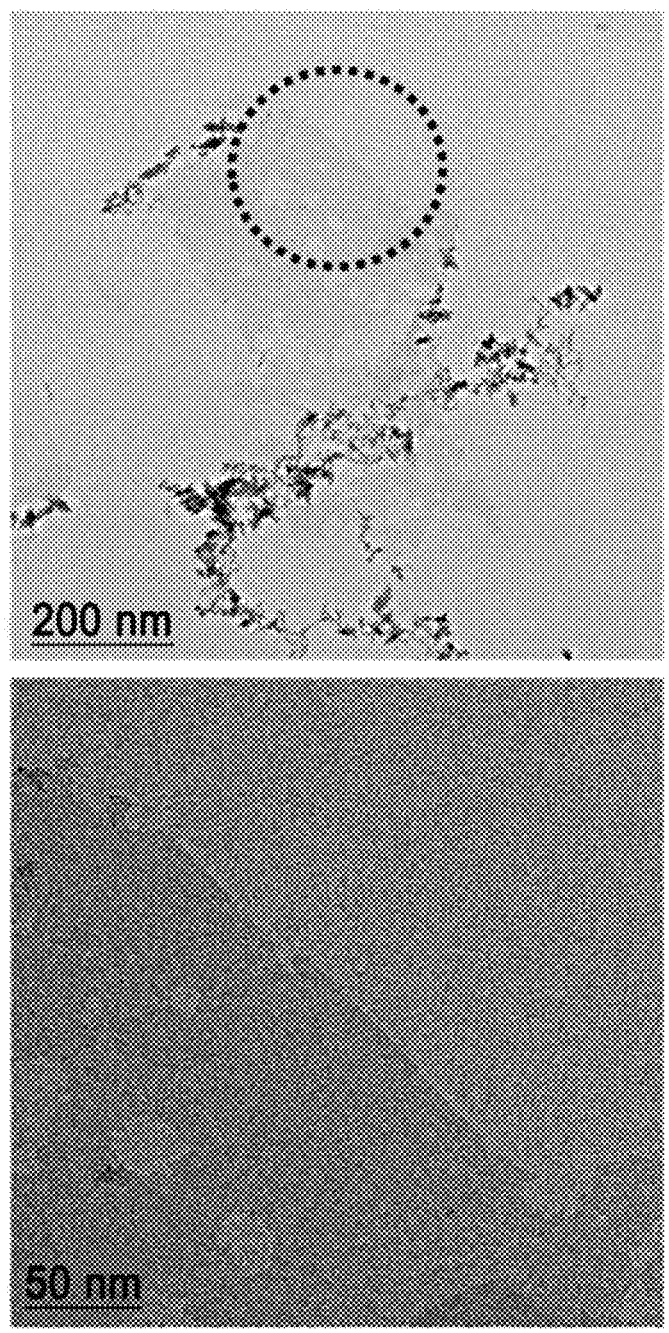
FIG. 8B is a TEM photograph of the product according to Example 3-1.
Figure 8C:
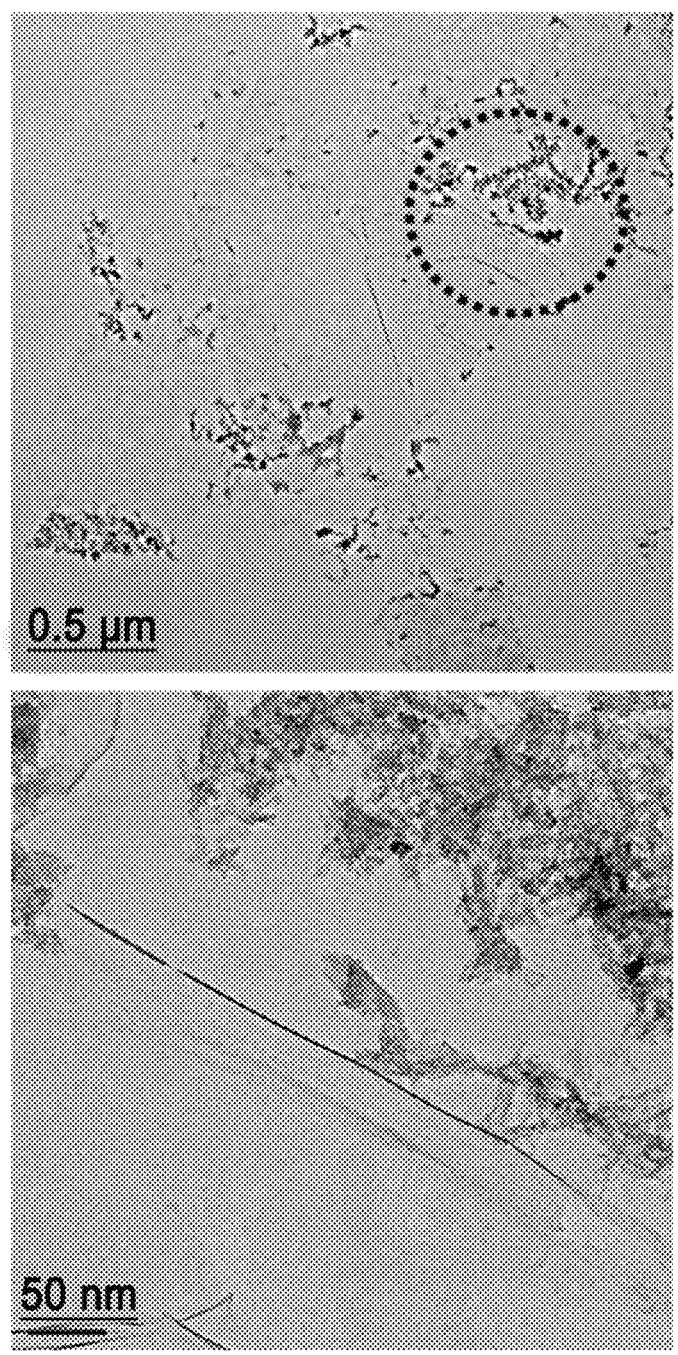
FIG. 8C is a TEM photograph of the product according to Example 3-2.

FIG. 8A is a TEM photograph of the shaking flow product. FIG. 8B is a TEM photograph of the product according to Example 3-1. FIG. 8C is a TEM photograph of the product according to Example 3-2.

Referring to FIG. 8A, when only the shaking flow was used, the single-layered MXenes could be exfoliated from the multi-layered MXenes, but it could be inferred that the yield of the single-layered MXenes was low because there were still a large amount of multi-layered MXenes. Referring to FIGS. 8B and 8C, it could be inferred that a high yield of single-layered MXenes could be exfoliated from the multi-layered MXenes when the single-layered MXenes were exfoliated from multi-layered MXenes with regular and high shear stress derived from a CT reactor.

Analyzing the experimental results comprehensively, one embodiment of the present disclosure can solve the problem of difficulty to exfoliate single-layered MXenes by conventional irregular stirring flow or ultrasonic treatment and increase the yield of single-layered MXenes without physical fragmenting of multi-layered MXenes.

Although preferred embodiments of the present disclosure have been described in detail above, the scope of the present disclosure is not limited thereto, and various modifications and improvements by those skilled in the art using the basic concept of the present disclosure as defined in the following claims are also presented. It belongs to the scope of the right of disclosure.

What is claimed is:

1. A method of preparing single-layered MXenes, the method comprising:
    exfoliating a single layer of MXenes from multi-layered MXenes with a Couette-Taylor reactor inducing a regular flow,
    wherein the CT reactor comprises:
        an outer cylinder and an inner cylinder having the same central axis and different radius and the inner cylinder rotates at 30 rpm or more for at least 5 minutes,
    wherein a method of preparing the multi-layered MXenes comprises:
        a first step of etching off an atomic layer from MAX, and
        a second step of stirring a mixture in which the MAX from which the atomic layer is etched off is mixed with deionized water.

2. The method of claim 1, wherein the MAX is a compound represented by the following Formula 1:

$$M_{n+1}AX_n \qquad \text{[Formula 1]}$$

Wherein M is a transition metal, A is any one element selected from Group 12 to Group 16 elements, X is carbon or nitrogen, and n is 1 to 4 in the Formula 1.

3. The method of claim 2, wherein M is any one element selected from the group consisting of Sc, Lu, Ti, Zr, Hf, V, Nb, Ta, Cr, Mo, Mn, Hb, and Co, and A is any one element selected from the group consisting of Cd, Al, Ga, In, TI, Si, Ge, Sn, Pb, P, As, and S, in the Formula 1.

4. The method of claim 1, wherein
    the first step comprises:
        preparing a first solution in which lithium fluoride and hydrochloric acid are mixed; and
        stirring a MAX suspension obtained by adding the MAX to the first solution.

5. The method of claim 4, wherein the stirring is performed with any one selected from the group consisting of a Rushton turbine agitator, a magnetic stirrer, and a combination thereof.

6. The method for claim 5, wherein a step of using the Rushton turbine agitator, is a step of stirring the MAX suspension at 1000 rpm or more for 5 hours or more.

7. The method for claim 5, wherein a step of using the magnetic stirrer is a step of stirring the MAX suspension at 300 rpm or more for 20 hours or more.

8. The method of claim 1, wherein the second step is a step of using any one method selected from the group consisting of a hand shaking method, a magnetic stirring method, and a combination thereof.

* * * * *